United States Patent
Tudryn et al.

(10) Patent No.: US 8,529,724 B2
(45) Date of Patent: Sep. 10, 2013

(54) ANODIC BONDING OF SILICON CARBIDE TO GLASS

(75) Inventors: Carissa Tudryn, Cambridge, MA (US); Jeffrey Borenstein, Holliston, MA (US); Ralph Hopkins, Chestnut Hill, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 1734 days.

(21) Appl. No.: 10/677,087

(22) Filed: Oct. 1, 2003

(65) Prior Publication Data

US 2005/0072189 A1  Apr. 7, 2005

(51) Int. Cl.
*B29C 65/00* (2006.01)
*C03B 23/20* (2006.01)
*C03C 27/06* (2006.01)

(52) U.S. Cl.
USPC .................. 156/273.1; 156/273.9; 156/272.2; 65/36; 65/40

(58) Field of Classification Search
None
See application file for complete search history.

(56) References Cited

U.S. PATENT DOCUMENTS

| | | | |
|---|---|---|---|
| 3,397,278 A | 8/1968 | Pomerantz | |
| 3,417,459 A | 12/1968 | Pomerantz | |
| 4,983,538 A | 1/1991 | Gotou | |
| 5,544,772 A | 8/1996 | Soave et al. | |
| 5,877,070 A * | 3/1999 | Goesele et al. | 438/458 |
| 6,150,239 A | 11/2000 | Goesele et al. | |
| 6,328,796 B1 | 12/2001 | Kub et al. | |
| 6,550,337 B1 * | 4/2003 | Wagner et al. | 73/715 |
| 6,562,127 B1 | 5/2003 | Kud et al. | |
| 6,607,969 B1 | 8/2003 | Kub et al. | |
| 7,165,463 B2 | 1/2007 | Liu et al. | |
| 2001/0021570 A1 | 9/2001 | Lin et al. | |
| 2002/0197761 A1 | 12/2002 | Patel et al. | |
| 2003/0057513 A1 | 3/2003 | Leedy | |

FOREIGN PATENT DOCUMENTS

| | | |
|---|---|---|
| DE | 4426288 A1 | 4/1996 |
| JP | 404164841 A | 6/1992 |
| JP | PCT/JP03/00570 * | 1/2002 |
| WO | WO 9107359 A1 | 5/1991 |

OTHER PUBLICATIONS

A. Berthold, L. Nicola, P.M. Sarro, M.J. Vellekoop, "Glass-to-glass anodic bonding with standard IC technology thin films as intermediate layers", Sensors and Actuators 82 2000 224-228.*
Lee, K.Y., Rishton, S.A., and Chang, T.H., "High aspect ratio aligned multilayer microstructure fabrication", Journal of Vacuum Science and Technology B, 12(6), 3425-3430, (1994).*
Schmidt, M.A., "Waver-to-wafer bonding for microstructure formaiton", Proceedings of the IEEE, 86(8), 1575-1585, (1998).*
Sarro, P.M., "Silicon carbide as a new MEMS technology", Sensors and Actuators A: Physical, 82(10 210-218, (2000).*
Spearing, S.M., "Materials issues in microelectromedhanical systems (MEMS)", Acta. Mater., 48, 179-196, (2000).*

(Continued)

*Primary Examiner* — Jason L Lazorcik
(74) *Attorney, Agent, or Firm* — Goodwin Procter LLP

(57) ABSTRACT

MEMS and microelectronic devices and fabrication methods feature providing a first material including a glass, providing a second material having an elastic modulus greater than the elastic modulus of silicon, causing the second material to have a surface with a RMS surface roughness of greater than 0.001 μm and less than approximately 0.15 μm, contacting the surface of the second material to a surface of the first material, and applying a voltage between the first and second materials to cause an anodic bond to form.

3 Claims, 3 Drawing Sheets

(56) References Cited

OTHER PUBLICATIONS

Rihwer L.E.S., Oliver, A.D., Collins M.V., "Wafer level micropackaging of MEMS devices using thin film anodic bonding", Mat. Res. Soc. Symp. Proc. vol. 729, (2002), pp. U5.7.1-U5.7.6.*

Gupta, R.K., Osterberg, P.M., Senturia, S.D., "Material property measurements of micromechanical polysilicon beams", SPIE 1996 Conference: Microlithography and Metrology in Micromachining II, Oct. 14-15, vol. 2880, (1996), pp. 1-7.*

Cozma, A., Puers, B., "characterization of teh elecrostatic bonding of silicon and pyrex", J. Micromech. Microeng. 5 (1995) 98-102.*

Lee, T., Lee, D., Liaw, C., Lao, A. Hsing, I-M., "Detailed characterization of anodic bonding process between glass and thin-film coated silicon substrates", Sensors and Actuators 86 (2000) 103-107.*

Di Cioccio, L., Letertre, F., Le Tiec, Y., papon, A., Jaussaud, C., Bruel, M., "Silicon carbide on insulator formation by the Smart-CUT® Process", Materials Science and Engineering B46 9 1997) 349-356.*

Lee et. al. (Electrochemical Society Proceedings, vol. 97-36; Semiconductor Wafer Bonding: Science, Technology, and Applications IV, (1998) pp. 200-204).*

DiCioccio et. al. (Materials Science and Engineering B46 (1997)349-356.*

Cioccio, L. Di, "Silicon Carbide on insulator formation using the Smart Cut process," *Electronics Letters*, vol. 32, 1996, pp. 1144-1145.

Hurd, D.S. et.al., "An experimental fracture mechanics study of a strong interface: The silicon/glass anodic bond," *Materials Research*, vol. 10, 1995, pp. 387-400.

Ko, W.H. et al. "Bonding Techniques for Microsensors", *Amsterdam: Elsevier Science Publishers*, 1985, pp. 41-61.

Lee, Duck-Jung et. al., "Effects of a hydrophilic surface in anodic bonding," *Journal of Micromechanics and Microengineering*, vol. 9, 1999, pp. 313-318.

Mehregany, M. et. al., "Silicon Carbide for Microelectromechanical Systems," *International Materials Reviews*, vol. 45, 2000, pp. 85-108.

Obermeier, E., "Anodic Wafer Bonding," *Electrochemical Society Proceedings*, vol. 95-7, 1995, pp 212-220.

Tong, Q.Y., et. al., "Fabrication of Single Crystalline SiC Layer on High Temperature Glass," *Journal of the Electrochemical Society*, vol. 144, 1997, pp. L111-L113.

Wallis, G. et al., "Field Assisted Glass-Metal Sealing.," *Journal of Applied Physics.*, vol. 40, 1969, pp. 3946-3949.

Yassen, A. A., et. al., "Fabrication and Testing of Surface Micromachined Polycrystalline SiC Micromotors," *I.E.E. Electron Device Letters*, vol. 21, 2000,pp. 164-166.

"*Formulas for Stress and Strain,*" by R. J. Roark and W. Young (New York: McGraw-Hill, 5th Ed., 1975, pp. 112-113).

"*Micromechanical properties of silicon-carbide thin films deposited using single-source chemical-vapor deposition,*" by C. R. Stoldt et al. (Applied Physics Letters, vol. 79, No. 3. Jul. 16, 2001, pp. 347-349).

"MatWeb, *The Online Materials Database*, Corning Pyrex 7740 Borosilicate Glass," 2007.

\* cited by examiner

_US 8,529,724 B2_

ANODIC BONDING OF SILICON CARBIDE TO GLASS

TECHNICAL FIELD

The invention generally relates to microelectronic and microelectromechanical devices. More particularly, in one embodiment, the invention is directed to a method for attaching a polycrystalline silicon carbide layer to a glass layer in such a device.

BACKGROUND INFORMATION

Many microelectromechanical system (MEMS) and microelectronic devices can be damaged if exposed to high temperatures during some fabrication steps, such as packaging steps. For example, the temperature of a die bonding process may be a significant concern when selecting a method to attach a MEMS component to a package substrate or to integrate a MEMS component with a microelectronic component.

A MEMS component can include a glass isolation layer that is attached to an alumina package component via one of a variety of die attach materials. A gold-tin brazing material is commonly used in microelectronic packaging, however, the brazing temperature will be too high for some types of components.

Other bonding techniques that can be used in MEMS or microelectronic devices include fusion bonding (for example, for silicon-to-silicon bonding), gold eutectic bonding (for example, for silicon-to-substrate bonding), and anodic bonding (for example, for silicon-to-glass; anodic bonding is also known as Field Assisted Bonding and Electrostatic Bonding.) These bonding processes typically require application of an elevated temperature. For example, a conventional silicon-to-silicon fusion bonding process utilizes a bonding temperature of above 1,000° C., and a conventional silicon-to-glass anodic bonding process utilizes a bonding temperature in a range of approximately 200° C. to 500° C., often approximately 450° C.

Many conventional bonding processes are not applicable when fabricating or packaging devices that involve temperature-sensitive components. Many proposed solutions to this bonding problem are either complex or poorly adaptable to large scale production.

Some MEMS devices include silicon carbide (SiC) components. For example, some devices include a portion of a single-crystal SiC wafer on an insulator layer. Such a structure is useful, for example, for microwave applications. The SiC-insulator structure can be formed by anodically bonding a flat single-crystal SiC wafer to a high temperature-resistance glass. The single-crystal SiC wafer used for anodic bonding typically has a root-mean-square surface roughness of less than 2.0 nm (i.e., less than 0.002 µm.) Conventional single-crystal SiC bonding is performed at temperatures as high as approximately 560° C. and voltages between 800-1000V.

Single-crystal SiC-on-glass substrates are used, for example, to grow epitaxial layers of GaN. SiC provides a suitable crystallographic match for GaN. Hence, GaN can be epitaxially grown on a highly polished, appropriately oriented surface of a single crystal of SiC. The GaN in turn is used, for example, to form blue light-emitting diodes and lasers.

In addition to requiring elevated temperature processing, some bonding materials, such as a gold-tin braze material, can creep after bond formation. Creep can cause a bond to be unstable and to fail. Unfortunately, substrates based on anodically bonded single-crystalline SiC generally are not of use in MEMS applications.

SUMMARY OF THE INVENTION

The invention generally relates to devices and packaging for microelectronic and MEMS applications. Features of the invention provide lower bonding temperatures, permit use of appropriate materials, and support simpler processing. The invention arises, in part, from the realization that a polycrystalline material having a large elastic modulus, such as SiC, and a surface roughness greater than that of a polished wafer can be anodically bonded to glass. The polycrystalline material and the bonding temperature can be well suited for microelectronic and MEMS device fabrication. The surface roughness of the polycrystalline material can be much greater than that of a polished single-crystal wafer yet, in a preferred embodiment, is less than that of polycrystalline silicon in some prior processes, i.e., less than approximately 1.0 µm.

The invention features, in one embodiment, anodic bonding of a polycrystalline SiC substrate or device component to a glass layer. The invention also features a wider range of anodic bonding voltages, for example, 200-1000V, and a lower range of anodic bonding temperatures, for example, 300° C.-350° C., than at times used in Si-to-glass anodic bonding. Suitable polycrystalline SiC can have a surface roughness much greater than that of a typical polished single-crystal SiC wafer, though less than that of a typical CVD polycrystalline SiC substrate. The relatively low bonding temperature is advantageous for MEMS applications.

Accordingly, in a first aspect, the invention features a method for anodic bonding. The method includes providing a first material including a glass, providing a second material having an elastic modulus greater than the elastic modulus of silicon, causing the second material to have a surface with a root-mean-square (RMS) surface roughness of greater than 0.001 µm and less than approximately 0.2 µm, contacting the surface of the second material to a surface of the first material, and applying a voltage between the first and second materials to cause an effective anodic bond to form at the interface between the two materials.

The glass of the first material can be selected, in part, for a suitable coefficient of thermal expansion (CTE). The glass can be, for example, a borosilicate or an aluminosilicate glass.

The first and second materials can be heated to a temperature that does not exceed approximately 350° C. while applying the voltage to promote anodic bonding. Anodic bonding may be accomplished at a voltage selected from a wide range of voltages, for example, a value in the range of 200 V to 1000 V. An effective bond can be formed, for example, in approximately 10 minutes or less.

The method is suited to second materials that have a relatively high elastic modulus, for example, greater than the elastic modulus of silicon. For example, the elastic modulus of the second material can be greater than 300 gigaPascals. According to principles of the invention, a relatively high elastic modulus material, like SiC, can be effectively bonded even if it has a surface roughness greater than a polished single-crystal wafer.

According to principles of the invention, some high elastic modulus materials, such as polycrystalline SiC, can be bonded when they have a RMS surface roughness greater than, for example, 0.001 µm, or even, for example, greater than 0.01 µm. In contrast to conventional silicon-to-glass anodic bonding, the second material, in a preferred embodiment, has a RMS surface roughness of less than approximately 0.15 µm, preferably, less than approximately 0.1 µm.

Polycrystalline SiC, for example, can be caused to have a surface with a RMS surface roughness of greater than 0.001 µm and less than approximately 0.2 µm by first forming the SiC and then partially polishing a surface of SiC. For example, polycrystalline SiC having a typical surface roughness of approximately 0.17 µm can be formed via chemical vapor deposition (CVD). The surface can then be polished to reduce the roughness to, for example, approximately 0.04 µm prior to bonding to glass.

The method can further include providing a third material having an elastic modulus greater than the elastic modulus of silicon, causing the third material to have a surface with a RMS surface roughness of greater than 0.001 µm and less than approximately 0.15 µm, contacting the surface of the third material to a surface of the first material, and applying a voltage between the first and third materials to cause an effective anodic bond to form between the first and third materials.

A glass layer can be thinned, for example, by polishing, prior to anodic bonding to the third material. For example, the glass layer can be thinned to 10.0 µm to provide, for example, a sandwich of a thin glass layer between two anodically bonded polycrystalline SiC substrates.

In another aspect, the invention features a method for fabricating a MEMS device. The method includes providing a device that includes a borosilicate and/or an aluminosilicate glass, providing a device package with a polycrystalline SiC portion, and anodically bonding the glass to the SiC in a manner as described above.

The above and further advantages of the invention may be better understood by referring to the following description taken in conjunction with the accompanying drawings, in which a depicted element may not be drawn to scale, like elements are referenced with like reference designations, and in which:

BRIEF DESCRIPTION OF THE DRAWINGS

FIG. 2b is detail view of a portion of the embodiment of FIG. 2a indicated by the dashed circle 2b in FIG. 2a.

DESCRIPTION OF THE ILLUSTRATIVE EMBODIMENT

Figure 1:
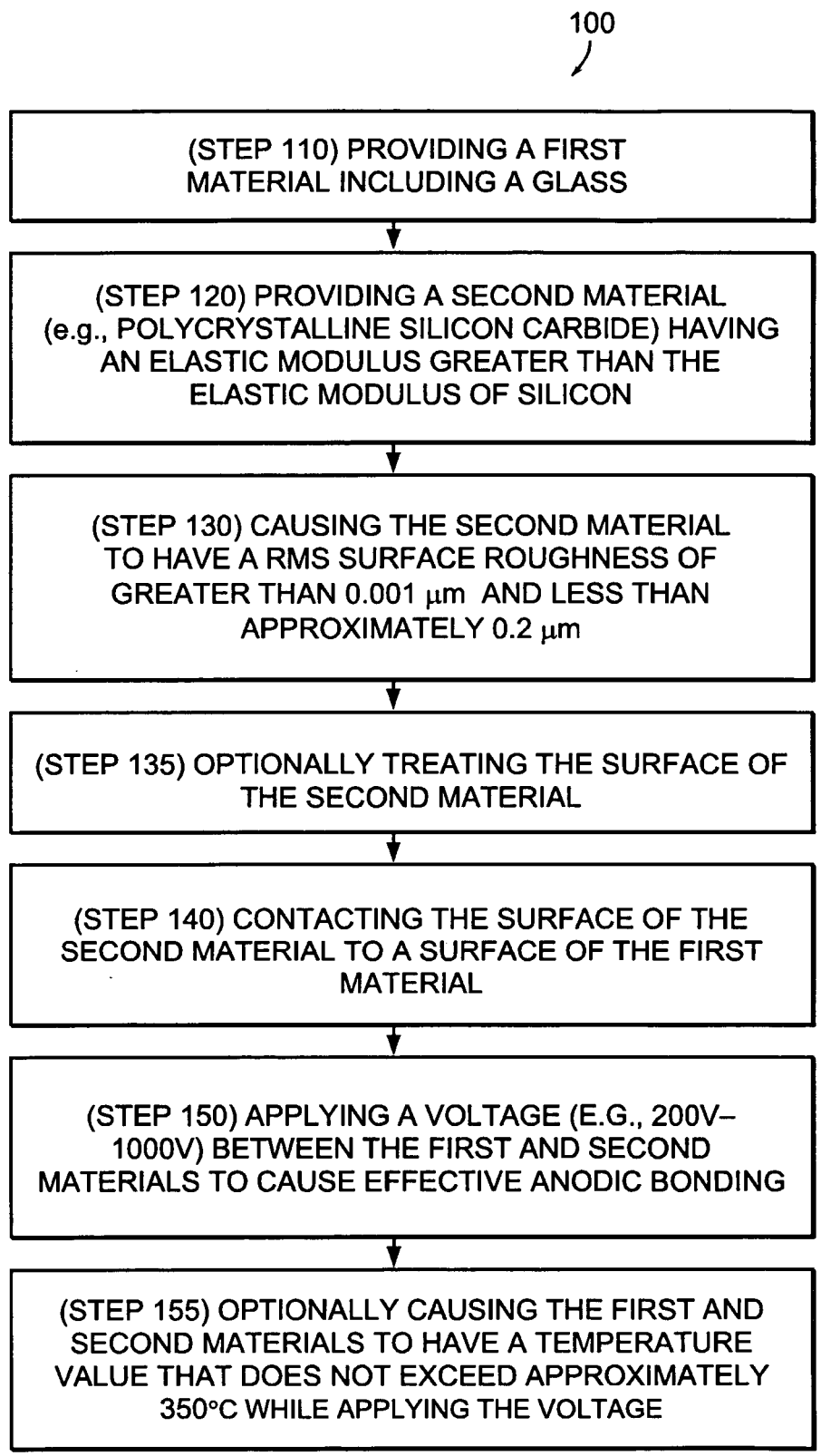
FIG. 1 is a flowchart of a method for anodic bonding according to an illustrative embodiment of the invention.

FIG. 1 is a flowchart of a method 100 for anodic bonding according to an illustrative embodiment of the invention. The method 100 includes providing a first material including a glass (Step 110), providing a second material having an elastic modulus greater than the elastic modulus of silicon (Step 120), causing the second material to have a RMS surface roughness of greater than 0.001 µm and, preferably, less than approximately 0.15 µm (Step 130), contacting the surface of the second material to a surface of the first material (Step 140), and applying a voltage between the first and second materials to cause effective anodic bonding (Step 150). An effective anodic bond is one that attaches the first material to the second material with satisfactory reliability under handling and use conditions.

Before bonding, the surface of the second material may be treated (Step 135). For example, a hydrophobic surface treatment may be applied to the surface. An effective bond may be formed with or without prior surface treatments.

The anodic bonding (Step 150) may be performed at a temperature value that does not exceed approximately 350° C. (Step 155), in contrast, for example, to conventional silicon anodic bonding at a temperature of approximately 450° C. The temperature and voltage can be applied for a length of time of, for example, approximately 10 minutes.

The first material may be, for example, a substrate layer of a MEMS or microelectronic device. The second material may be, for example, a portion of the completed device, or may be a portion of a package.

In some embodiments of the invention, the glass of the first material is selected for a CTE that is compatible with both the CTE of silicon and with the CTE of the second material. For example, if the second material is SiC, the glass may be a borosilicate glass or an aluminosilicate glass. Commercial examples of suitable glasses include Corning Pyrex® 7740 borosilicate glass (Corning Incorporated, Corning, N.Y.) and HOYA SD-2 zinc-aluminosilicate glass (Hoya Corporation USA, San Jose, Calif.) Such glasses have beneficial characteristics for MEMS device production.

In some embodiments of the invention, the second material is polycrystalline SiC, as may be formed via CVD. SiC has many useful features, such as high strength, hardness, thermal conductivity, large band-gap, high breakdown field, good saturation velocity, and favorable CTE. SiC also is good for hostile environments with severe temperatures, pressures, and corrosiveness.

The bonding method 100 may be applied, for example, to MEMS sensor parts, MEMS packaging, and semiconductor device applications. For example, in an illustrative embodiment according to principles of the invention, MEMS components can be fabricated on a silicon substrate. The backside of the silicon substrate can have a RMS roughness of approximately 1 µm, and can be attached to a glass layer (see Step 110), for example, via conventional silicon-to-glass anodic bonding.

According to principles of the invention, the glass layer in turn can be attached to a polycrystalline SiC layer (see Step 120) having a RMS surface roughness greater than that of a typical single-crystal wafer, but less than the RMS roughness of the backside of the silicon substrate (see Step 130). The glass layer and the polycrystalline SiC layer can be bonded by applying a voltage across the two layers (see Step 150) while heating the layers to a temperature of approximately 350° C. or less (see Step 155). Thus, anodic bonding can be utilized both for conventional silicon-to-glass bonding and for polycrystalline SiC-to-glass bonding under appropriate conditions according to principles of the invention.

The anodic bonding method 100 also has several advantages when used for die attachment relative to prior die attachment methods. The anodic bond between the first and second materials can have high strength and low stress, and can be formed at a temperature below that which would damage structures on the die.

Polycrystalline SiC, for example, can be caused to have a surface with a RMS surface roughness of greater than 0.001 µm and less than approximately 0.2 µm (see Step 130) by first forming the SiC and then partially polishing a surface of the SiC. For example, polycrystalline SiC having a typical surface roughness of approximately 0.17 µm can be formed via chemical vapor deposition (CVD). The surface can then be polished to reduce the roughness to, for example, approximately 0.045 µm prior to bonding to glass (see Step 150).

Figure 2A:
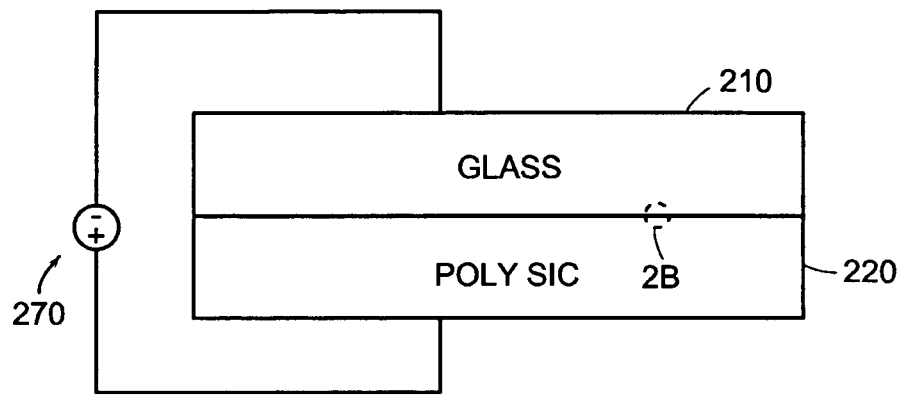
FIG. 2a is a cross sectional view of a glass layer and a ceramic layer being bonded to each other according to an illustrative embodiment of the invention.

FIG. 2a is a cross sectional view of two materials being bonded to each other according to an illustrative embodiment of the invention. A glass layer 210 is contacted to a polycrystalline SiC layer 220. A voltage is applied to the contacted layers 210, 220 via a voltage supply 270. The layers 210, 220, are heated to a desired temperature during bonding, at least in the vicinity of their contacted surfaces.

Figure 2B:
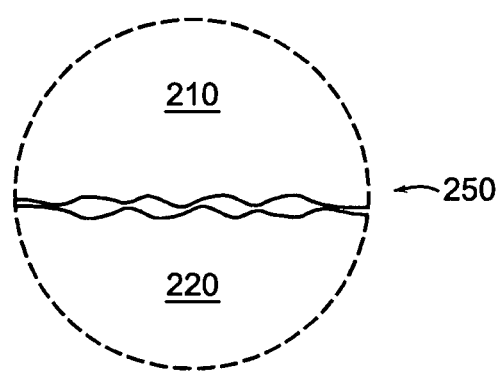

FIG. 2b is a detail view of the portion of FIG. 2a indicated by the dashed circle 2b. Prior to bonding, the surfaces of the two layers 210, 220 touch at discreet locations due to surface roughness. The surface of the SiC has a RMS roughness greater than a typical RMS roughness of a single-crystal SiC wafer, i.e., greater than 1.0 nm (0.001 µm.) The RMS roughness may be greater than 0.01 µm and still support effective anodic bonding at relatively low temperatures, i.e., temperatures below approximately 350° C.

For effectively anodic bonding, the RMS roughness of the surface of the SiC should also be less than that which is acceptable for conventional silicon-to-glass anodic bonding. Specifically, the RMS roughness is less than 0.5 µm, preferably less than 0.2 µm, and, more preferably, less than 0.14 µm. A suitable range of RMS roughness is, for example, approximately 0.010 µm to approximately 0.05 µm.

Figure 3:
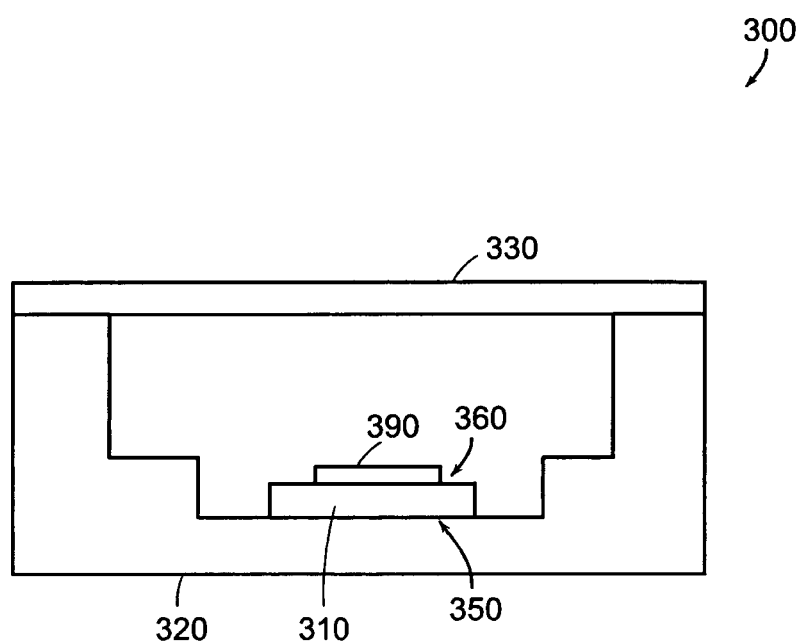
FIG. 3 is a cross sectional view of a MEMS device according to an illustrative embodiment of the invention.

FIG. 3 is a cross sectional view of a MEMS device 300 according to an illustrative embodiment of the invention. The device 300 includes an active device portion 390, a glass layer 310, a polycrystalline SiC substrate 320, and a lid 330. The glass is anodically bonded to the device portion 390 at an interface 360, and the glass layer 310 is anodically bonded to the substrate 320 at an interface 350. The glass layer 310 may be bonded to the substrate 320 via, for example, the method 100.

The device 300 has several advantages relative to some prior MEMS devices. The active device portion 390 is subjected to less mechanical stress and has a more stable bond to its packaging substrate than many prior devices. While a gold-tin braze bond, for example, will often creep and degrade over time, the anodic bond of the glass layer 310 to the polycrystalline SiC substrate 320 can provide an effectively stable and low stress bond to support desired device 300 performance.

For example, a high performance MEMS gyroscope can benefit from features of the invention by having a reduced temperature sensitivity, hysteresis and vibration sensitivity relative to prior gyroscopes. The device 300 can also be, for example, a radio-frequency (RF) device, a gyroscope, a micromotor, an accelerometer, or an optical device. For example, a MEMS RF switch including a polycrystalline SiC substrate, according to principles of the invention, may reduce transmission losses in comparison to a convention MEMS silicon-based RF switch. The use of SiC may also support a simpler transition from a MEMS component to a package.

While production of many prior MEMS devices has entailed substantial customized engineering efforts to develop the packaging, features of the invention support a more generic packaging process. Thus, device development time can be reduced.

Variations, modifications, and other implementations of what is described herein will occur to those of ordinary skill in the art without departing from the spirit and the scope of the invention. The invention is not to be defined only by the preceding illustrative description.

What is claimed is:

1. A method for anodic bonding at least a portion of a MEMS device, the method comprising:
   providing a first layer comprising a glass;
   providing a first substrate comprising a polycrystalline material having an elastic modulus greater than about 300 gigaPascals;
   causing a first surface of the first substrate to have an RMS surface roughness of greater than 0.001 µm and less than about 0.2 µm;
   directly contacting the first surface of the first substrate to a surface of the first layer; and
   applying a voltage between the first layer and the first substrate, through electrical contacts in direct contact with each of the first layer and the material having an elastic modulus greater than about 300 gigaPascals, to cause an effective anodic bond to form directly between the first layer and the first substrate;
   wherein the method further comprises causing the first layer and the first substrate to have a temperature that does not exceed about 350° C. while applying the voltage.

2. A method for packaging a MEMS component, the method comprising:
   providing a MEMS component comprising a glass layer having a surface and consisting essentially of at least one of a borosilicate glass and an aluminosilicate glass;
   providing a device package comprising a material having an elastic modulus greater than about 300 gigaPascals, formed from polycrystalline silicon carbide and having a first surface with an RMS surface roughness of greater than 0.001µm and less than about 0.2 µm;
   contacting the first surface of the package to the surface of the glass layer; and
   causing the first surface of the package and the glass layer to have a temperature value that does not exceed about 350° C. while applying a voltage to form an effective bond between the MEMS component and the package, wherein the voltage is applied between the glass layer and the package through electrical contacts in direct contact with each of the glass layer and the material having an elastic modulus greater than about 300 gigaPascals.

3. A method for anodic bonding at least a portion of a MEMS device, the method comprising:
   providing a first layer comprising a glass;
   providing a first substrate comprising a material having an elastic modulus greater than about 300 gigaPascals;
   causing a first surface of the first substrate to have an RMS surface roughness of greater than 0.001 µm and less than about 0.2 µm;
   directly contacting the first surface of the first substrate to a surface of the first layer; and
   causing the first layer and the first substrate to have a temperature that does not exceed about 350° C. while applying a voltage between the first layer and the first substrate, through electrical contacts in direct contact with each of the first layer and the material having an elastic modulus greater than about 300 gigaPascals, to cause an effective anodic bond to form directly between the first layer and the first substrate.

* * * * *